United States Patent [19]

Shilling et al.

[11] 3,763,395

[45] Oct. 2, 1973

[54] INTERFERENCE SUPPRESSION CIRCUITS

[75] Inventors: Michael John Shilling, Kingston, England; Eric Peak, Glenrothes, Scotland

[73] Assignee: RCA Corporation, New York, N.Y.

[22] Filed: Dec. 30, 1971

[21] Appl. No.: 214,119

[30] Foreign Application Priority Data

July 30, 1971 Great Britain .................... 3,057/71

[52] U.S. Cl. .............. 315/307, 307/252 B, 307/305

[51] Int. Cl. .......................................... H05b 39/04

[58] Field of Search ........................... 315/307, 311; 307/252 B, 305

[56] References Cited

UNITED STATES PATENTS

| | | | |
|---|---|---|---|
| 3,447,067 | 5/1969 | Spofford | 307/305 X |
| 3,461,317 | 8/1969 | Morgan | 307/252 B |
| 3,500,124 | 3/1970 | Babcock | 307/305 X |

OTHER PUBLICATIONS

Galloway, "Using the Triac for Control of AC Power", pp. 1,9,10,11, G.E. Application Notes 200.35 3/1966.

*Primary Examiner*—Alfred L. Brody
*Attorney*—Edward J. Norton

[57] ABSTRACT

In a thyristor switching circuit which includes an LC filter, means responsive to the collapse of principal current through said thyristor are provided for preventing the thyristor from commutating into an off state during midcycle, said means including an inductance which is also included in the LC filter.

10 Claims, 12 Drawing Figures

INTERFERENCE SUPPRESSION CIRCUITS

This invention relates to thyristor switching circuits and, more particularly, to interference suppression circuits for use therewith in controlling the supply of power to a load.

The triac or bidirectional triode thyristor is a three terminal solid-state switch which is normally triggered into conduction by the application of a pulse to its gate electrode in the presence of an applied bias to its main terminal electrodes, the direction of current conduction through the device being dependent upon the polarity of the applied bias.

The popularity of triac controlled incandescent lamp dimmers has resulted in the commercialization of a multiplicity of such circuits, some satisfactory and others suffering from defects which often make them unacceptable in a domestic environment. These circuits are generally of the "phase control" type wherein the power delivered to the load is controlled by variation of the phase angle at which triac switching initiates current flow. Basically they include, in addition to the triac, an adjustable RC time constant circuit for controlling the phase angle at which the triac is switched into its conducting or "on" state, a triggering element such as a diac for providing a pulse to the gate electrode of the triac when the time constant circuit has been charged to the desired level, and a filtering network to provide radio frequency interference (RFI) suppression.

One of the problems encountered in the use of triac dimmer circuits is a phenomenon known as "flicker" which, as its name implies, produces an objectionable visual flickering in the lamp load. This effect is generally more apparent in the case of lighting loads of less than 100 watts, as will be explained in more detail hereinafter, the severity of the problem being related to the RFI suppression requirements imposed upon the circuit and the operating environment. For example, in the United States simplified RFI suppression filters consisting of a 0.1 microfarad ($\mu$f) capacitor and a 0.1 millihenry (mh) inductor are generally used with satisfaction due to the absence of commercial broadcasts in the 150KHz–250KHz band. In countries which utilize this band for broadcast purposes the use of such filters are precluded. In Great Britain, for example, a regulatory provision has been proposed which would impose stringent RFI suppression requirements thereby further compounding the flicker problem.

A switching circuit in accordance with the present invention comprises a thyristor adapted to control the supply of power to a load; a time constant circuit for controlling the phase angle at which said thyristor is switched into conduction; an LC filter; and means including an inductance responsive to the conduction state of said thyristor for preventing said thyristor from commutating into an off state during midcycle.

The present invention will be more readily understood upon reading the present specification in conjunction with the accompanying drawing wherein.

Figure 6:
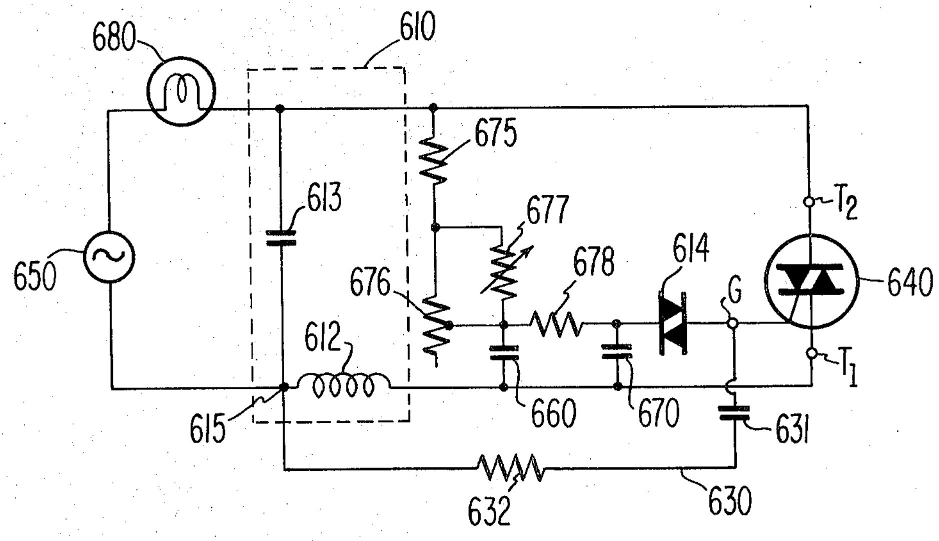
Figure 7A:
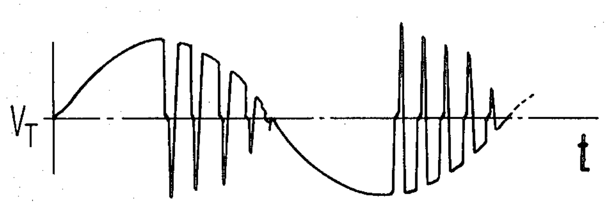
Figure 7B:
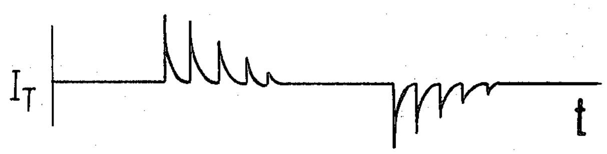
Figure 7C:
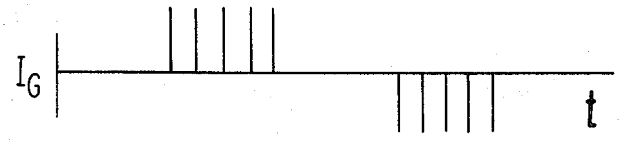
Figure 8A:
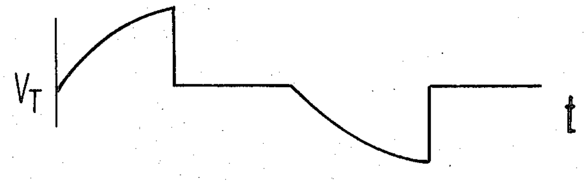
Figure 8B:
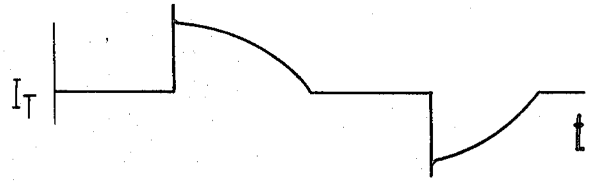
Figure 8C:
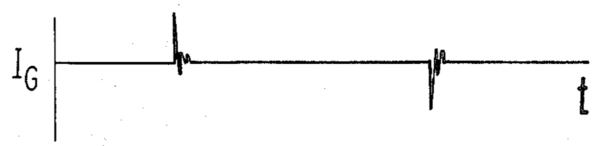

FIG. 6 is a circuit diagram of a triac dimmer circuit embodying the present invention; and FIGS. 7*a*, 7*b* and 7*c* and 8*a*, 8*b* and 8*c* are a series of waveforms helpful in understanding the present invention.

To understand the theories which have been advanced to explain the cause of the flicker phenomenon, it is desirable to first discuss some of the characteristics of a triac which contribute to the problem; for example, the critical rate of rise of off-state voltage, holding current, and turn-off time characteristics. Also significant is an understanding of the RFI problems associated with triac switching circuits, how they have been overcome in the prior art, and how they contribute to the flicker problem.

Figure 1:
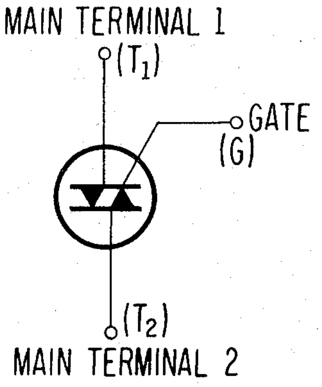
FIG. 1 is a schematic diagram of a triac as used in this application.

Referring first to FIG. 1, it will be seen that a triac is a three terminal solid-state switch having a first main terminal electrode designated $T_1$, a second main terminal electrode designated $T_2$, and a gate electrode designated G. The triac is bidirectional, dependent upon the polarity of potential applied across its main terminal electrodes, and can be triggered into conduction in any of four operating modes as summarized below (all polarities taken with terminal $T_1$ as the point of reference potential):

| Operating Quadrant | $V_G$ | $V_{T2}$ |
|---|---|---|
| I (+) | positive | positive |
| I (−) | negative | positive |
| III (+) | positive | negative |
| III (−) | negative | negative |

The gate-trigger requirements of the triac are different in each of the operating quadrants, generally being most sensitive in the I (+) and III (−) modes. When triggered into conduction, the potential drop across the device is negligible and all of the electrodes (i.e. $T_1$, $T_2$ and G) operate at substantially the same potential. When the device is in a nonconducting or "off" state, terminal $T_1$ and gate electrode G will be at substantially the same potential and terminal $T_2$ will be at a substantially different potential dependent upon the applied source of potential. This is due to the fact that the gate electrode G and main terminal electrode $T_1$ are effectively coupled via a low internal impedance.

Because of its internal capacitance, the forward blocking capability of a triac is sensitive to the rate at which the forward or bias voltage is applied across the main terminals of the device. A steep rising voltage impressed across the main terminals causes a capacitive charging current which is a function of the rate of rise of the off-state voltage ($i = C\,dv/dt$) to flow through the device; off-state voltage being defined as that range of voltage; either transient or steady state, which the device can withstand without switching into conduction. If the rate of rise of forward voltage exceeds a critical value, the capacitive charging current may become large enough to trigger the device. The steeper the wavefront of applied forward voltage, the smaller the value of breakover voltage, i.e. the voltage at which the device will switch into conduction. This dv/dt capability (i.e. the ability to withstand a charging current without triggering) is temperature sensitive, decreasing as the temperature rises.

After a triac has been switched into its conducting or low impedance state, a certain minimum holding current is required to maintain the device in such an "on" state. Should the current through the device drop below this critical level of holding current the triac cannot maintain regeneration and will revert to its high impedance or "off" state. This holding current parameter is also temperature sensitive, increasing as the temperature decreases.

Turn-off time is defined as the time interval between zero current and the time of reapplication of positive foward blocking voltage under specified conditions with the device remaining in the off state after having been in the on state.

The fast switching action of triacs when they turn into resistive loads (e.g. light bulbs) causes the current to rise to the instantaneous value determined by the load in a very short period of time. Triacs switch from the high to the low impedance state within 1 or 2 microseconds and the current through the device must rise from essentially zero to full-load value during this period. This fast switching action produces a current step which is largely composed of high-harmonic frequencies of several megahertz that have an amplitude varying inversely as the frequency. In phase-control applications, such as light dimming, this current step is produced on each half-cycle of the input voltage. Because the switching occurs many times a second (e.g. 100 times a second for a 50 cycle frequency), a noise pulse is generated into frequency sensitive devices such as AM and shortwave radios causing annoying interference. The amplitude of the high frequency components of the current step is generally of such low level as not to interfere with TV or FM radio reception. Although the level of radio frequency interference (RFI) produced by triac switching is well below that produced by most ac/dc brush type electronic motors, some type of RFI suppression network is usually added.

There are two basic types of radio frequency interference associated with the switching action of triacs. One form, i.e. radiated RFI, consists of the high frequency energy radiated through the air from equipment. In most cases, this radiated RFI is insufficient to cause any significant interference unless the radio is located very close to the source of radiation.

Figure 2:
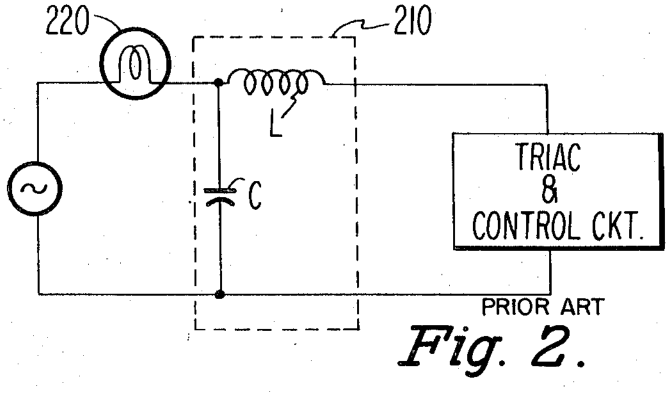
FIGS. 2–4 are generalized representations of dimmer circuits, including radio frequency interference (RFI) networks, in accordance with the prior art.
Figure 3:
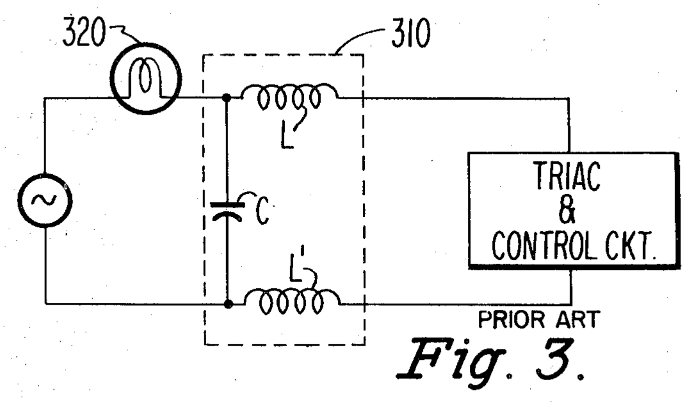

Of more significance is conducted RFI which is carried through the power lines and affects equipment connected to the same power lines. Because the composition of the current waveshape consists of higher frequencies, a simple choke placed in series with th load increases the current rise time and reduces the amplitude of the higher harmonics. To be effective, however, such a choke must be quite large. More effective filters, and ones that have been found adequate for most light dimming applications, are shown in FIGS. 2 and 3. The LC filters shown in FIGS. 2 and 3 provide adequate attenuation of the high-frequency harmonics and reduce the noise interference to a low level. The capacitors, which are connected across the entire network, bypass high frequency signals so that they are not coupled to any external circuits through the power lines.

As previously discussed, an objectionable visual flickering is often encountered in the use of triac dimmer circuits with lighting loads of less than 100 watts. Although the exact cause of this problem has not been resolved, some theories have been advanced in the literature.

The problem is recognized by J. H. Galloway in a Mar., 1966 Application Note published by the General Electric Company entitled "Using the Triac for Control of AC Power." In accordance with the theory advanced therein, and with reference to the circuits shown in FIGG. 2 and 3 of this specification, the RFI suppression filter (210, 310) and the triac of the respective circuits form a resonant discharge circuit having a resonant frequency governed primarily by the parameters of the RFI filter which in turn are determined by the desired degree of RFI suppression; the discharge circuit being dependent upon the impedance of the load (220, 320) for, the condition being worse for small lighting loads (i.e. incandescent lamps of less than 100 watts) which contribute little damping to the circuit. If the Q of the resonant circuit increases beyond a critical level, the oscillatory current generated by the switching transient in the resonant circuit will be of sufficient amplitude and polarity to cause the triac to turn off. To obtain proper operation with low wattage loads, it is suggested that additional damping be built into the RFI suppression filter. This can be done by adding a resistor R and an additional capacitor C' as shown in FIG. 4.

An additional discussion of the flicker problem appears in RCA Application Note 4316 published July, 1970 by A. E. Hilling and entitled "Triac Control Circuit for Incandescent Lamps". Hilling also recognizes that at the resonant frequency of the suppression components the oscillatory current is magnified by the loaded Q of the circuit and, if the amplitude of this current is sufficiently large to override the main load current, it will cause the triac to switch off. Accordingly, in addition to recognizing the solution set forth by Galloway, Hilling recognizes that by reducing the loaded Q of the RFI network the amplitude of the oscillatory current may be reduced such that it cannot overcome the load current. This can be achieved by using the circuit of FIG. 4 or by using the circuits shown in FIGS. 2 and 3 with lossy chokes (i.e. chokes having an unloaded Q approximately equal to unity) in lieu of the high Q (e.g. ferrite) chokes commonly used.

Both Hilling and Galloway recognize that triacs with slow dv/dt capability or poor turn-off characteristics may not suffer from the flicker effect because they are incapable of responding quickly enough and consequently remain in the conducting state.

Figure 4:
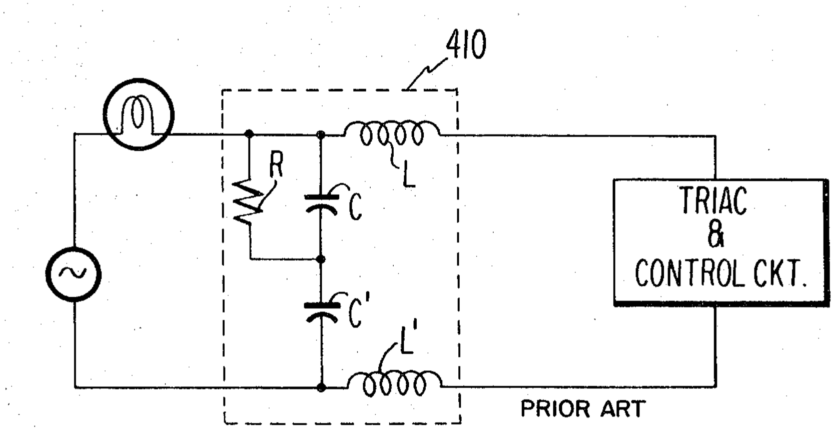

Although both of the solutions proposed by the forementioned articles overcome the flicker problem, the introduction of an additional RC circuit of the size required for the circuit of FIG. 4, or the use of lossy chokes in lieu of high Q chokes, is expensive. Moreover, since a lamp dimming circuit is generally designed to fit into a very confined wall space, it is desirable not to introduce additional components which will contribute any significant additional bulk to the circuit.

In a commonly assigned copending application, Ser. No. 214,120, filed contemporaneously with this application, a circuit is disclosed which overcomes the flicker problem discussed supra in a satisfactory and inexpensive manner. The circuit disclosed therein is shown in FIG. 5 of the present application and will be seen to comprise a triac having first and second main terminal electrodes and a gate electrode; a time constant circuit for controlling the phase angle at which the triac is switched into conduction; means for providing a current pulse to the gate electrode of the triac when the time constant circuit has been charged to a desired level; a filtering network for the suppression of radio frequency interference generated by the switching action of the triac, said network connected in circuit with the main terminal electrodes of the triac; and a second time constant circuit comprising a resistance in series with a capacitance connected between the gate electrode and a given one of said main terminal electrodes of the triac, said RC circuit responding to the rate of change of voltage at said given terminal electrode with respect to the gate electrode to provide a current pulse to the gate electrode should the triac begin to commutate into the off state during midcycle, whereby the triac is prevented from commutating off during midcycle.

Figure 5:
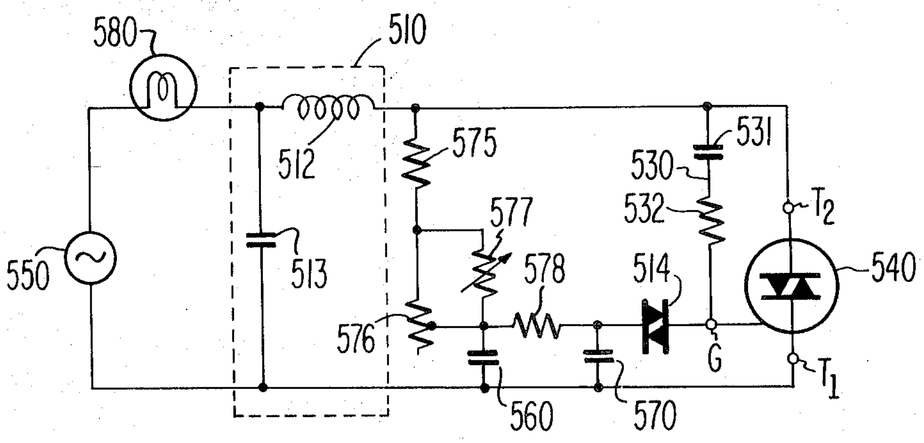
FIG. 5 is a circuit diagram of a triac dimmer circuit which overcomes the flicker problem.

In the circuit of FIG. 5, should the triac 540 begin to commutate into an off state during midcycle (e.g. in response to the oscillatory current of the resonant discharge circuit as discussed supra), the potential at terminal $T_2$ of the triac 540 with respect to the gate electrode G will attempt to instantaneously rise (as limited by the stray capacitance of the triac) to the level of the supply voltage 550. The resulting change in potential difference across terminal $T_2$ and gate electrode G will cause a charging current ($i = C$ dv/dt) to flow through the RC circuit 530 comprising resistor 532 and capacitor 531 which current will in turn be fed to the gate electrode G and maintain the triac 540 in its conducting state; capacitor 531 being selected such that it is incapable of triggering the triac 540 from the line voltage 550 when the triac is in the off state. As discussed in the forementioned copending application, it will be appreciated that due to the substantially instantaneous rate of rise of voltage at terminal $T_2$ of the triac should it attempt to commutate off during midcycle, a relatively small capacitor will provide a relatively large charging current. Moreover, as discussed therein, resistor 532 is selected to limit the current provided by the capacitor to the triac at turn on and also selected so as to help prevent the triac from inadvertently triggering into conduction as a result of small transients on the power line. However, a problem relating to the satisfactory operation of the circuit shown in FIG. 5 may arise when the load is operated off of a power line that carries high levels of noise interference. For example, noise spikes generated by unsuppressed or poorly suppressed machines and equipment may be capable of turning on the dimmer triac via the previously described RC network. Accordingly, an alternate solution was developed which detects internally generated dv/dt transients at the onset of "flicker" and responds thereto by preventing the triac from commutating off during midcycle and which, at the same time, is relatively insensitive to high dv/dt spikes conducted along the ac supply which may be generated by interfering equipment.

FIG. 6 is illustrative of a light dimming circuit in accordance with the present invention. Those skilled in the art will recognize the circuit of FIG. 6 as a basic double time-constant light dimmer circuit including a triggering diac 614 and an RFI suppression filter 610 comprising an inductor 612 and a capacitor 613, with the addition of an RC circuit 630 comprising a resistor 632 and a capacitor 631 connected between the gate electrode G of the triac and the junction 615 between inductor 612 and capacitor 613.

Turning now to a description of the operation of the circuit shown in FIG. 6, during the beginning of each half-cycle the triac 640 is in the off state and the entire line voltage 650 appears across the main terminals of the triac. At the same time capacitors 660 and 670 are charged through the potentiometer comprising resistors 675, 676, 677 and 678. During this time any noise spikes present on the ac supply line are applied simultaneously to the triac gate (G) via the RC circuit 630 and to main terminal electrode $T_1$ of the triac via inductor 612, the net result being that no effective gate signal is applied and the triac remains in the off state. When the voltage across capacitor 670 reaches the breakover voltage of the diac 614, capacitor 670 discharges through diac 614 into the gate electrode G of the triac 640 thereby causing the triac 640 to trigger into conduction. At this point in time the line voltage 650 is transferred from the triac 640 to the load 680 for the remainder of the half cycle. If the potentiometer resistance is reduced via variable resistor 677, capacitor 670 will charge more rapidly and diac 614 will break over earlier in the cycle, increasing the power supplied to load 680 and hence the intensity of the light. If the potentiometer resistance is increased, triggering occurs later in the cycle, load power is decreased, and the light intensity reduced. Capacitor 660 reduces hysteresis in the circuit by charging to a higher voltage than capacitor 670 and restoring some charge to capacitor 670 at triggering.

In the circuit of FIG. 6, should the triac begin to commutate into the off state during midcycle (e.g. in response to the oscillatory current of the resonant discharge circuit as discussed supra), the principal current flowing through the main terminal electrodes $T_1$, $T_2$ of the triac 640 will collapse. At such time the inductor 612 will endeavor to maintain the current flowing through it and the energy stored therein will discharge through the path comprising the RC network 630 and the gate to main terminal electrode $T_1$ of the triac resulting in a potential being applied between the gate and main terminal electrode $T_1$ of the triac thereby causing the triac to revert to its "on" condition. Ao in the case of the circuit shown in FIG. 5, capacitor 631 is selected such that it is incapable of triggering the triac 640 from the line voltage 650 when the triac is in the off state. Resistor 632 is selected to limit the current flow to the gate electrode from inductor 610.

The waveforms of FIGS. 7 and 8 are illustrative of triac voltage ($V_t$), triac current ($I_t$), and gate current ($I_g$) for the circuit of FIG. 6 supplying a 25 watt lamp from a 240 volt 50 cycle source, with the RC circuit 630 omitted (i.e. in accordance with the prior art) and present, respectively. In FIG. 7, which is representative of the circuit undergoing flicker, it will be seen that the triac rapidly switches into and out of conduction several times during the course of each half cycle. In FIG. 8, which is representative of a circuit in accordance with the present invention (i.e. FIG. 6) it will be seen that the triac is prevented from switching off during midcycle by the spike of gate current ($I_g$) provided via the RC network 630.

The embodiment depicted in FIG. 6 was constructed using the following components, and the waveforms of FIGS. 7 and 8 are based thereon:

| Element | Value |
|---|---|
| 612 | 1.2 millihenrys |
| 613 | 0.022 microfarads |
| 614 | RCA 40583 diac |
| 640 | RCA 40669 triac |
| 660, 670 | 0.1 microfarads |
| 675 | 5600 ohms |
| 676 | 250,000 ohms |
| 677 | 500,000 ohms |
| 678 | 3900 ohms |
| 631 | 2200 picofarads |
| 632 | 47 ohms |

It will be evident that the selection of capacitor 631 for the circuit shown in FIG. 6 is less critical than the selection of capacitor 531 in FIG. 5. This is because in the case of FIG. 5 the gate current provided to prevent triac commutation is determined in accordance with the relationship $I = C$ dv/dt as discussed supra, whereas in the case of FIG. 6 gate current is dependent upon the energy stored in the inductor 612. However, although the range is considerably wider in the case of the circuit representing the present invention, it has been found that the selection of capacitor 631 is dependent to some degree upon the gate sensitivity of the triac and will vary in relationship therewith. For example, in the case of a triac having a gate sensitivity of 20 milliamps in the I (+) and III (−) modes a capacitor of 2,200 picofarads was found to operate satisfactorily; increasing the value of the capacitor to 5,400 picofarads permitted a reduction in the sensitivity requirements to 30 milliamps with equal circuit performance.

Accordingly, there has been disclosed an inexpensive means for eliminating the objectionable visual flickering often encountered when using triac dimmer circuits to supply small lighting loads from distribution AC power lines.

What is claimed is:

1. In a switching circuit comprising a thyristor adapted for connection to an alternating current source and a load to be supplied from said alternating current source; means for connecting said thyristor in circuit with said load and said alternating current source; a time constant network responsive to said alternating current source and connected in circuit with said thyristor for controlling the phase angle at which said thyristor is switched into conduction; and a filtering network connected in circuit with said thyristor for the suppression of interference generated by the switching action of said thyristor, the improvement comprising:

circuit means coupled to said thyristor and responsive to the collapse of load current through said thyristor for preventing said thyristor from commutating into an off state during midcycle.

2. The invention as defined in claim 1 wherein said filtering network comprises an inductor-capacitor circuit with forms a resonant discharge circuit with said triac that is dependent upon the impedance of said load for damping, the Q of said resonant circuit being above a critical level such that the oscillating current of said resonant discharge circuit would be sufficient to cause said triac to commutate into an off state during midcycle.

3. The invention as defined in claim 2 wherein said thyristor comprises a triac having first and second main terminal electrodes and a gate electrode, and wherein said inductor is connected at one end thereof to a given one of said main terminal electrodes and at the other end thereof through said circuit means to said gate electrode.

4. The invention as defined in claim 3 wherein said circuit means comprises a resistor-capacitor circuit.

5. A switching circuit for controlling the supply of power to a load from a source of alternating current comprising:

a triac having first and second main terminal electrodes and a gate electrode;

means for connecting said first and second main terminal electrodes in circuit with said alternating current source and said load;

a time constant network responsive to said alternating current source and connected in circuit with said triac electrodes for controlling the phase angle at which said triac switches into conduction;

an interference suppression network comprising an inductor-capacitor circuit connected in circuit with said main terminal electrodes of said triac, said suppression network and said triac forming a resonant discharge circuit which is dependent upon the impedance of said load for damping, the Q of said resonant circuit being above a critical level such that the oscillatory current of said resonant discharge circuit would be sufficient to cause said triac to commutate into an off state during midcycle; and circuit means connected on one end thereof to said gate electrode and at the other end thereof to a given one of said main terminal electrodes through the inductor of said suppression network, wherethrough the energy stored in said inductor is applied to said gate electrode in response to the collapse of load current through said triac main terminal electrodes to prevent said triac from commutating off during midcycle.

6. A switching circuit as defined in claim 5 wherein said circuit means comprises a series resistor-capacitor network.

7. In a switching circuit comprising a triac having first and second main terminal electrodes and a gate electrode; means for connecting said main terminal electrodes in circuit with an incandescent lamp load and an alternating current source; a time constant network responsive to said alternating current source and connected in circuit with said triac electrodes for controlling the phase angle at which said triac is switched into conduction; and a radio frequency interference suppression network comprising an inductor and a capacitor connected in circuit with said main terminal electrodes, wherein said suppression network and said triac form a resonant discharge circuit which is dependent upon the impedance of said incandescent lamp load for damping, and wherein the Q of said resonant circuit is above a critical level such that the oscillatory current of said resonant discharge circuit would be sufficient to cause said triac to commutate into an off state during midcycle thereby causing said lamp load to flicker, the improvement comprising:

a resistor-capacitor network connected in circuit with said inductor between said gate electrode and a given one of said main terminal electrodes to provide therethrough an output current to said gate electrode in response to the collapse of load current through said triac to prevent said triac from commutating into an off state during midcycle, whereby said lamp load is prevented from flickering.

8. In a circuit which includes a thyristor having main electrodes and a gate electrode, a load in circuit with said thyristor, connections for a source of power coupled to said load and thyristor, and an inductor-capacitor network in circuit with the thyristor and load forming a resonant therewith, and which circuit tends to be driven into oscillation at a frequency substantially higher than the power frequency when said thyristor is turned on by a turn-on signal applied to said gate electrode, said oscillations being at an amplitude sufficient intermittently to turn off said thyristor, a circuit for lessening said tendency of said thyristor intermittently to turn off comprising:

a feedback path which exhibits a relatively low impedance at the frequency of said oscillations and a relatively high impedance at the power frequency, said feedback path being connected in circuit with said inductor between said gate electrode and a given one of said main electrodes to provide therethrough a signal to said gate electrode in response to the collapse of load current through said thyristor which signal tends to maintain said thyristor in its conducting state when an oscillation across said main electrodes tends to drive said thyristor to cut off.

9. In a circuit as set forth in claim 8, said feedback circuit comprising a resistor of relatively low value in series with a capacitor.

10. In a circuit as set forth in claim 8, the means for turning on said thyristor comprising a phase delay network coupled to said connections and a triggering device connected between said phase delay network and said gate electrode, said feedback path being connected between said inductor and a circuit point intermediate said triggering device and said gate electrode.

* * * * *